United States Patent
Mise et al.

(10) Patent No.: US 6,710,647 B1
(45) Date of Patent: Mar. 23, 2004

(54) METHOD AND CIRCUIT FOR DISTORTION COMPENSATION AND OUTPUT CONTROL

(75) Inventors: Toshio Mise, Tokyo (JP); Tomohiro Tanabe, Osaka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/129,821

(22) PCT Filed: Sep. 27, 2000

(86) PCT No.: PCT/JP00/06672

§ 371 (c)(1),
(2), (4) Date: May 9, 2002

(87) PCT Pub. No.: WO02/27921

PCT Pub. Date: Apr. 4, 2002

(51) Int. Cl.$^7$ ................................................. H03G 3/20
(52) U.S. Cl. ......................... 330/86; 330/129; 330/144
(58) Field of Search ......................... 330/86, 134, 136, 330/144, 149, 284, 129

(56) References Cited

U.S. PATENT DOCUMENTS 5,469,105 A * 11/1995 Sparks ........................ 330/129
5,748,037 A * 5/1998 Rozental et al. ......... 330/149 X

FOREIGN PATENT DOCUMENTS

| JP | 57-97712 | 6/1982 |
|----|----------|--------|
| JP | 132417/1983 | 9/1983 |
| JP | 63-10611 | 3/1988 |
| JP | 4-373218 | 12/1992 |
| JP | 2576357 | 11/1996 |
| JP | 9-261292 | 10/1997 |

* cited by examiner

*Primary Examiner*—Steven J. Mottola
(74) *Attorney, Agent, or Firm*—Oblon, Spivak, McClelland, Maier & Neustadt, P.C.

(57) ABSTRACT

A distortion compensation output control circuit has an adder 1 for adding a value of input electric power and a value of a part of output electric power negatively fed backed together, a variable attenuator 2 for attenuating the electric power output from the adder 1, an electric power amplifier 3 for amplifying the electric power output from the variable attenuator 2 and outputting the output electric power set to a prescribed value, a variable attenuator 4 for attenuating the output electric power output from the electric power amplifier 3 and negatively feeding back the attenuated output electric power to the adder 1, a control circuit 12 for controlling the variable attenuator 4 so as to obtain the output electric power of the prescribed value, and a control circuit 11 for controlling the variable attenuator 2 so as to obtain a loop gain depending the output electric power of the prescribed value.

4 Claims, 6 Drawing Sheets

METHOD AND CIRCUIT FOR DISTORTION COMPENSATION AND OUTPUT CONTROL

TECHNICAL FIELD

The present invention relates to a distortion compensation output control circuit and a distortion compensation output control method in which distortion compensation and output control are performed.

BACKGROUND ART

FIG. 1 is a block diagram showing the configuration of a conventional distortion compensation output control circuit disclosed in Japanese Patent Gazette No. 2576357. In FIG. 1, 1 indicates an adder for adding a value of input electric power and a value of a part of output electric power negatively fed backed together. 2 indicates a variable attenuator for attenuating the electric power output from the adder 1. 3 indicates an electric power amplifier for amplifying the electric power output from the variable attenuator 2 and outputting output electric power set to a prescribed value. 4 indicates a variable attenuator for attenuating the output electric power output from the electric power amplifier 3 and negatively feeding back the attenuated output electric power to the adder 1. 5 indicates a control circuit for controlling the variable attenuator 4 so as to obtain the output electric power of the prescribed value and controlling the variable attenuator 2 so as to always set a loop gain of a feedback loop to a constant value. As is described above, the conventional distortion compensation output control circuit has forward side elements composed of both the variable attenuator 2 and the electric power amplifier 3, feedback side elements composed of both the variable attenuator 4 and the adder 1 and the control circuit 5. Also, in the conventional distortion compensation output control circuit, input electric power is amplified, output electric power set to a prescribed value is output, a feedback loop is formed to perform negative feedback of a part of the output electric power, and distortion occurring in the amplification of the input electric power is compensated.

Next, an operation will be described below.

Normally, in cases where a level (or value) of output electric power is changed in the conventional distortion compensation output control circuit, a level of the output electric power negatively fed back to the adder 1 is changed in the variable attenuator 4 to change a level of the output electric power. In this case, in the Patent Gazette, the variable attenuator 2 is controlled by the control circuit 5 according to a degree of change performed in the variable attenuator 4 so as to always set a loop gain in the conventional distortion compensation output control circuit to a constant value. Therefore, a stable output control can be always performed.

FIG. 2 is a view showing a quantity of distortion with respect to the output electric power of the electric power amplifier 3. In general, a distortion characteristic of the output electric power of the electric power amplifier 3 is not always constant. As shown in FIG. 2, a quantity of distortion is increased or decreased according to the output electric power. However, in the conventional distortion compensation output control circuit, even though the output electric power is controlled, the variable attenuator 2 is controlled so as to always set the loop gain to a constant value. In this case, even though the quantity of distortion is small and the value of the output electric power is low, the loop gain is still set to a constant value. Therefore, the setting of the loop gain to a constant value causes various problems such as the increase of noise electric power and phase oscillation peculiar to the conventional distortion compensation output control circuit. For example, it is allowed that a quantity of distortion compensation for the output electric power of a level B shown in FIG. 2 is lower than that for the output electric power of a level A shown in FIG. 2, and no distortion compensation is required of the output electric power of a level C shown in FIG. 2.

Also, FIG. 3 is a view showing a quantity of distortion with respect to the output electric power of the electric power amplifier 3 which has characteristics of a higher order function. As shown in FIG. 3, In dependence on the configuration of the electric power amplifier 3, there is a case where the electric power amplifier 3 has characteristics of a higher order function in which a quantity of distortion in the whole forward side elements is not constant with respect to the output electric power. In cases where the output electric power of a level A shown in FIG. 3 is changed to the output electric power of a level B shown in FIG. 3, a range of distortion compensation cannot be satisfied, and it is expected that an absolute quantity of distortion for the output electric power of the level B is higher than that for the output electric power of the level A. As is described above, in cases where a quantity of distortion is changed according to the output electric power, it is difficult to obtain stable performance.

Because the conventional distortion compensation output control circuit has the configuration described above, in cases where a quantity of distortion in the electric power amplifier 3 has characteristics of a higher order function with respect to the output electric power and is changed according to the output electric power, a problem has arisen that it is difficult to obtain stable performance.

Also, when the output electric power is controlled, the variable attenuator 2 is controlled so as to always set the loop gain to a constant value. Therefore, another problem has arisen that the increase of noise electric power and phase oscillation are caused.

The present invention is provided to solve the above-described problems, and the object of the present invention is to provide a distortion compensation output control circuit and a distortion compensation output control method in which a quantity of distortion is controlled according to output electric power while controlling the output electric power and stable performance can be obtained.

Also, the object of the present invention is to provide a distortion compensation output control circuit and a distortion compensation output control method in which a feedback loop is set to an off condition in cases where a large quantity of output control is performed and a quantity of distortion is small due to output electric power of a low value, and probability of causing problems such as the increase of noise electric power and phase oscillation is prevented.

DISCLOSURE OF THE INVENTION

A distortion compensation output control circuit according to the present invention, in which input electric power is amplified, output electric power of a prescribed value is output, a feedback loop is formed to perform negative feedback of a part of the output electric power and distortion occurring in the amplification of electric power is compensated, comprises an adder for adding a value of the input electric power and a value of the part of the output electric power negatively fed back together, first gain changing means for increasing or decreasing a value of electric power output from the adder, an electric power amplifier for amplifying electric power output from the first gain changing means and outputting the output electric power of the prescribed value, second gain changing means for attenuating the output electric power output fron the electric power amplifier and negatively feeding back the output electric power to the adder, a second control circuit for controlling the second gain changing means so as to obtain the output electric power of the prescribed value, and a first control circuit for controlling the first gain changing means so as to obtain a loop gain of the feedback loop corresponding to the prescribed value of the output electric power.

Therefore, a quantity of the distortion can be controlled according to the output electric power, and stable performance can be obtained.

A distortion compensation output control circuit according to the present invention further comprises a switching circuit for setting the feedback loop to the adder to an on condition or an off condition. The feedback loop is set to the off condition by the switching circuit in a case where the prescribed value of the output electric power is low and a quantity of the distortion in the output electric power is small, and the first gain changing means is controlled so as to obtain the output electric power of the prescribed value in the first control circuit.

Therefore, probability of causing problems such as the increase of noise electric power and phase oscillation can be prevented.

A distortion compensation output control method according to the present invention, in which input electric power is amplified, output electric power of a prescribed value is output, a feedback loop is formed to perform negative feedback of a part of the output electric power and distortion occurring in the amplification of electric power according to both a forward side gain and a feedback side gain is compensated, comprises the steps of controlling the feedback side gain so as to obtain the output electric power of the prescribed value, and controlling the forward side gain so as to obtain a loop gain of the feedback loop corresponding to the prescribed value of the output electric power.

Therefore, a quantity of the distortion can be controlled according to the output electric power, and stable performance can be obtained.

A distortion compensation output control method according to the present invention further comprises the steps of setting the feedback loop to an off condition in a case where the prescribed value of the output electric power is low and a quantity of the distortion in the output electric power is small, and controlling the forward side gain so as to obtain the output electric power of the prescribed value.

Therefore, probability of causing problems such as the increase of noise electric power and phase oscillation can be prevented.

BEST MODE FOR CARRYING OUT THE INVENTION

Hereinafter, the best mode for carrying out the present invention will now be described with reference to the accompanying drawings to explain the present invention in more detail.

EMBODIMENT 1

Figure 4:
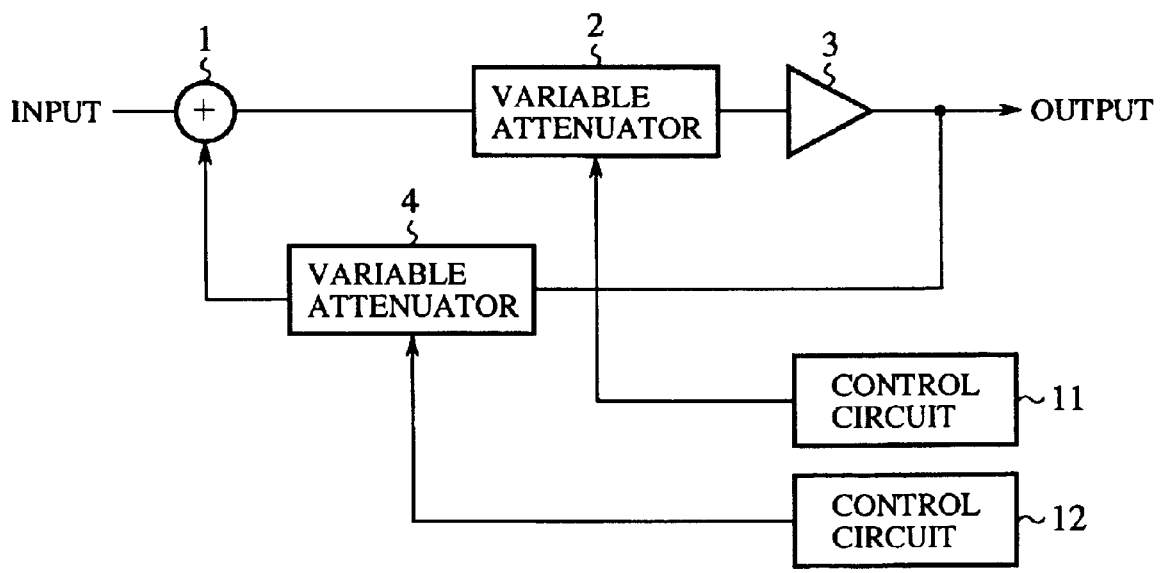
FIG. 4 is a block diagram showing the configuration of a distortion compensation output control circuit according to a first embodiment of the present invention.

FIG. 4 is a block diagram showing the configuration of a distortion compensation output control circuit according to a first embodiment of the present invention. In FIG. 4, 1 indicates an adder for adding a value of input electric power and a value of a part of output electric power negatively fed backed together. 2 indicates a variable attenuator (or first gain changing means) for attenuating the electric power output from the adder 1. 3 indicates an electric power amplifier for amplifying the electric power output from the variable attenuator 2 and outputting output electric power set to a prescribed value. 4 indicates a variable attenuator (or second gain changing means) for attenuating the output electric power output from the electric power amplifier 3 and negatively feeding back the attenuated output electric power to the adder 1.

11 indicates a control circuit (or a first control circuit) for controlling the variable attenuator 2 so as to obtain a loop gain depending the output electric power of the prescribed value. 12 indicates a control circuit (or a second control circuit) for controlling the variable attenuator 4 so as to obtain the output electric power of the prescribed value. The control circuits 11 and 12 have the configurations respectively so as to respectively perform table or function control operations independent from each other.

As is described above, in the example shown in FIG. 4, the distortion compensation output control circuit comprises forward side elements composed of both the variable attenuator 2 and the electric power amplifier 3, feedback side elements composed of both the variable attenuator 4 and the adder 1, and the control circuits 11 and 12. In the distortion compensation output control circuit, a value of input electric power is amplified, output electric power set to a prescribed value is output, a feedback loop is formed to perform negative feedback of a part of the output electric power, and distortion occurring in the amplification of the input electric power is compensated.

Next, an operation will be described below.

Figure 5:
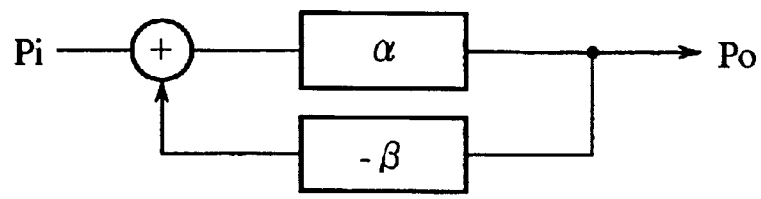
FIG. 5 is a brief model view showing the distortion compensation output control circuit according to the first embodiment of the present invention.

FIG. 5 is a view showing a brief model of the distortion compensation output control circuit. A forward side gain is expressed by $\alpha$, a feedback side gain is expressed by $\beta$, and a value of the input electric power is expressed by Pi. In this case, a value Po of the output electric power is expressed according to a following equation (1).

$$Po = \alpha \cdot Pi/(1+\alpha\beta) \qquad (1)$$

Here, αβ denotes a loop gain. In cases where it is assumed that the loop gain αβ is sufficiently higher than unity, the replacement 1+αβ≈αβ can be performed. Therefore, the equation (1) can be simplified to a following equation (2).

$$Po = Pi/\beta \qquad (2)$$

In short, the control of the output electric power performed in the distortion compensation output control circuit depends on the feedback side gain β and is hardly exerted by the influence of the forward side gain α. Therefore, only the loop gain αβ can be set to a changeable value regardless of the value of the output electric power by controlling both the forward side gain α and the feedback side gain β, and both the output electric power and the quantity of distortion can be simultaneously controlled by using the changeable loop gain αβ. Also, in the equation (1), it is assumed that the loop gain αβ is sufficiently higher than 1, and the equation (1) is simplified to the equation(2). However, the value of the out put electric power is actually changed by almost 1/αβ by controlling the forward side gain α. In cases where this influence cannot be disregarded, a degree of lowering the gain can be compensated by controlling the feedback side gain β.

Here, the variable attenuator 2 corresponds to the forward side gain α, the variable attenuator 4 corresponds to the feedback side gain β, the variable attenuators 2 and 4 are controlled by respectively using tables or functions different from each other, and the compensation of the degree of lowering the gain is performed. In detail, the variable attenuator 4 (the feedback side gain β) is controlled by the control circuit 12 so as to obtain the output electric power of the prescribed value, and the variable attenuator 2 is controlled by the control circuit 11 so as to obtain the loop gain αβ corresponding to the output electric power of the prescribed value.

Figure 6:
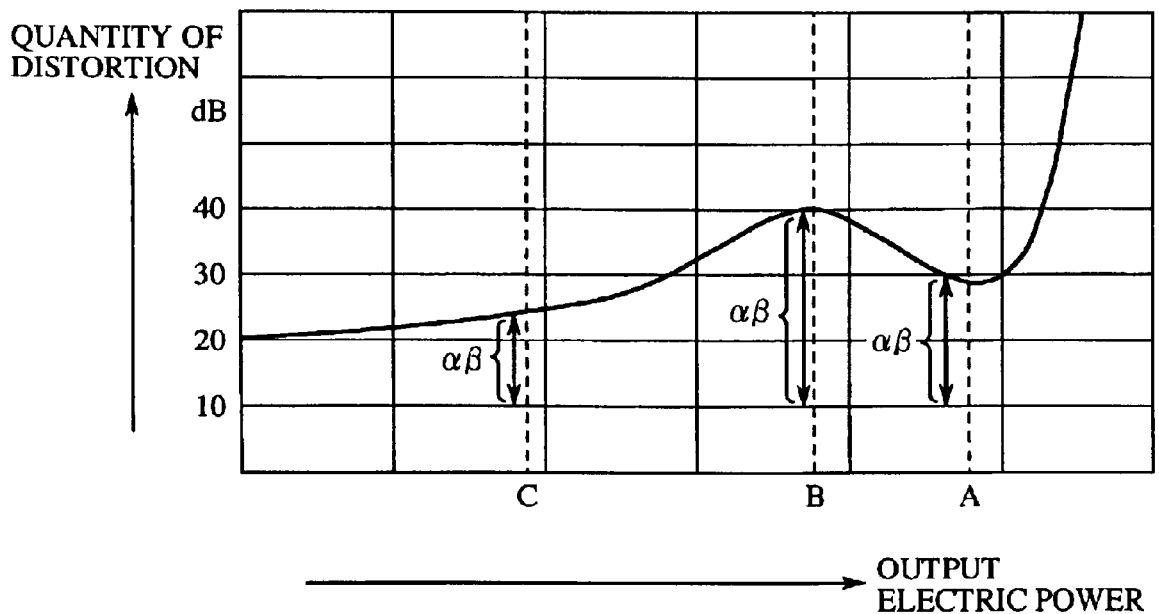
FIG. 6 is a view explaining the relationship between a quantity of distortion and a loop gain according to the first embodiment of the present invention.

FIG. 6 is a view explaining the relationship between the quantity of distortion and the loop gain αβ. In FIG. 6, a quantity of distortion for the output electric power of a value A, a quantity of distortion for the output electric power of a value B and a quantity of distortion for the output electric power of a value C are 30 dB, 40 dB and 25 dB respectively. An upper limit of the quantity of distortion required of the distortion compensation output control circuit is, for example, set to 10 dB. In cases where the loop gain αβ is set to 20 dB so as to suppress the quantity of distortion for the output electric power of the value A to a value equal to or lower than the required value of 10 dB, because the loop gain αβ is constant in the prior art, the quantity of distortion for the output electric power of the value B exceeds the required value of 10 dB.

However, in this embodiment, the feedback side gain β is controlled by the control circuit 12 so as to obtain the loop gain αβ set to 20 dB for the output electric power of the value A, the loop gain αβ set to 30 for the output electric power of the value B and the loop gain αβ set to 15 dB for the output electric power of the value C, and the forward side gain a is controlled by the control circuit 11. Therefore, even though the output electric power is set to any value, the quantity of distortion can be suppressed to a value equal to or lower than a required value according to the output electric power.

Figure 7:
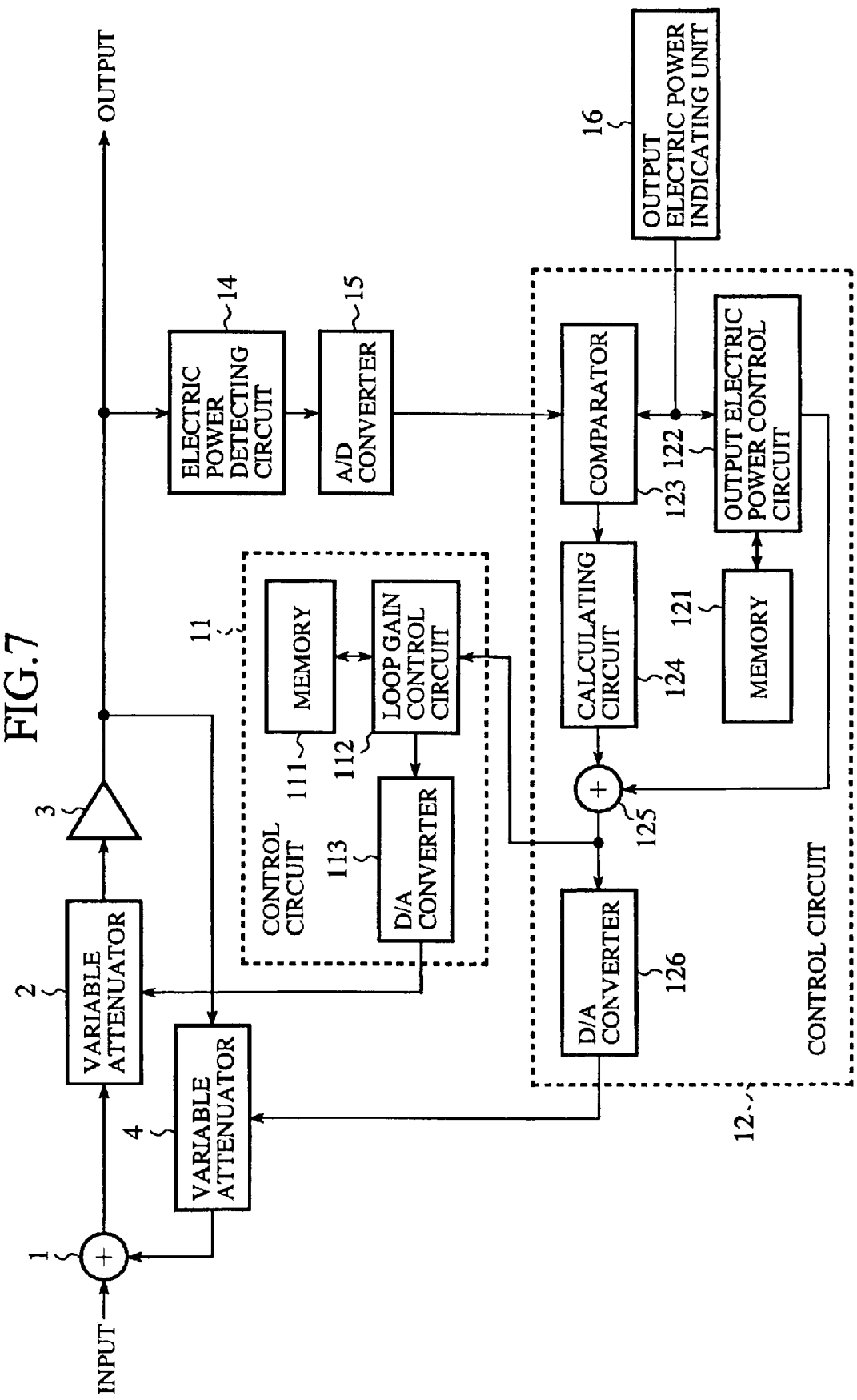
FIG. 7 is a block diagram showing an embodied configuration of the distortion compensation output control circuit shown in FIG. 4.

FIG. 7 is a block diagram showing an embodied configuration of the distortion compensation output control circuit shown in FIG. 4. In FIG. 7, a phase of output electric power output from the electric power amplifier 3 is detected in an electric power detecting circuit 14, the phase-detected output electric power is converted into a digital signal in an A/D converter 15, and the digital signal is input to a comparator 123 of the control circuit 12. An instruction indicating out put electric power of a prescribed value to be out put from the electric power amplifier 3 is output from an output electric power indicating unit 16 to an out put electric power control circuit 122 and the comparator 123.

In the control circuit 12, a plurality of reference values set in advance in correspondence to values of the output electric power for the purpose of controlling the variable attenuator 4 are stored in a memory 121 in a form of a function or a table. In the output electric power control circuit 122, in response to the instruction indicating the output electric power of the prescribed value received from the output electric power indicating unit 16, a reference value corresponding to the output electric power of the prescribed value is read out from the memory 121 for the purpose of controlling the variable attenuator 4, and the reference value is output to the adder 125.

In the comparator 123, the phase-detected output electric power indicated by the A/D converter 15 is compared with the output electric power of the prescribed value indicated by the output electric power indicating unit 16, and a value of differential electric power denoting a difference between a value of the phase-detected output electric power and the prescribed value of the output electric power is output.

In a calculating circuit 124, a correction value is calculated according to the differential electric power output from the comparator 123 for the purpose of controlling the variable attenuator 4. In the adder 125, the reference value output from the output electric power control circuit 122 for the purpose of controlling the variable attenuator 4 is added to the correction value output from the calculating circuit 124 for the purpose of controlling the variable attenuator 4, and a setting value is output for the purpose of controlling the variable attenuator 4. In a D/A converter 126, the setting value is converted into an analog signal, and the setting value is input to the variable attenuator 4.

The variable attenuator 4 is controlled according to the input setting value, and the output electric power of the prescribed value is output from the electric power amplifier 3.

In the control circuit 11, other kind of setting values corresponding to setting values used for the purpose of controlling the variable attenuator 4 are stored in a memory 111 in a form of a function or a table for the purpose of controlling the variable attenuator 2. In a loop gain control circuit 112, a setting value, which corresponds to the setting value output from the adder 125 of the control circuit 12 for the purpose of controlling the variable attenuator 4, is read out from the memory 111 for the purpose of controlling the variable attenuator 2. The setting value readout from the memory 111 is converted into an analog signal in the D/A converter 113 and is input to the variable attenuator 2.

The variable attenuator 2 is controlled according to the input setting value, and a prescribed loop gain is obtained.

As is described above, the distortion compensation output control circuit according to the first embodiment comprises the adder 1, the variable attenuator 2, the electric power amplifier 3, the variable attenuator 4 and the control circuits 11 and 12. However, the first embodiment can be applied for a distortion compensation output control circuit having the configuration such as the configuration using a Cartesian feedback method or the configuration using a predistortion method in which a part of a transmission output is negatively fed back to an input side element.

Also, in the first embodiment, the variable attenuator 2 and the variable attenuator 4 are used to change the gains. However, any gain changing means can be used on condition that the gains are changed by the gain changing means. In particular, as to the element for changing the forward side gain, the first embodiment is not limited to the element for attenuating the forward side gain. For example, variable amplifier can be applied to change the forward side gain.

As is described above, in the first embodiment, the feedback side gain changing means (the feedback side gain A) is controlled by the control circuit 12 so as to obtain the output electric power of the prescribed value, and the forward side gain changing means is controlled by the control circuit 11 so as to obtain the loop gain a,a corresponding to the output electric power of the prescribed value. Accordingly, the quantity of distortion can be controlled according to the output electric power and stable performance can be obtained.

Also, in the first embodiment, the output electric power and the distortion characteristic always stabilized can be obtained, and a degree of free in the selection of an element functioning as the electric power amplifier 3 can be improved.

EMBODIMENT 2

Figure 1:
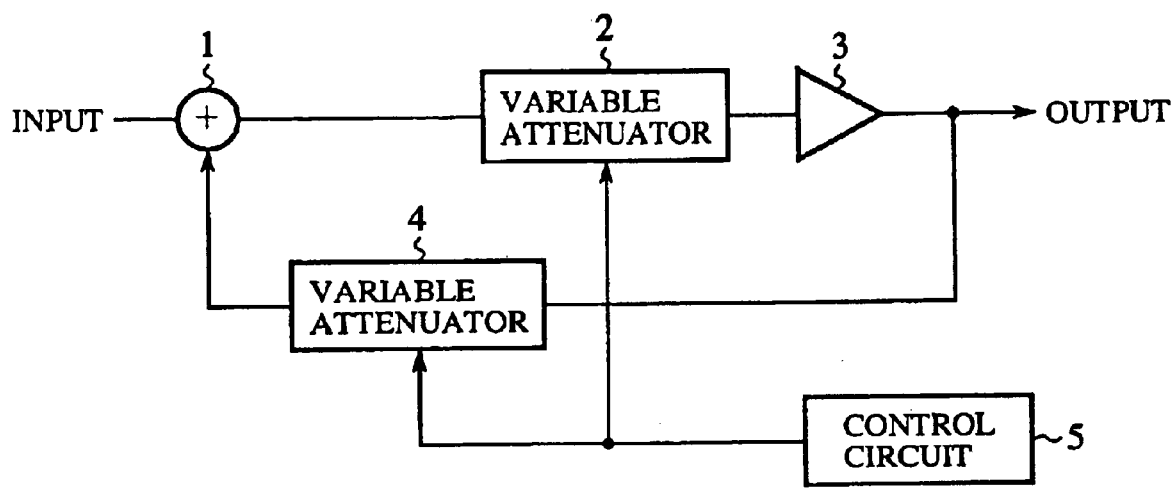
FIG. 1 is a block diagram showing the configuration of a conventional distortion compensation output control circuit.
Figure 2:
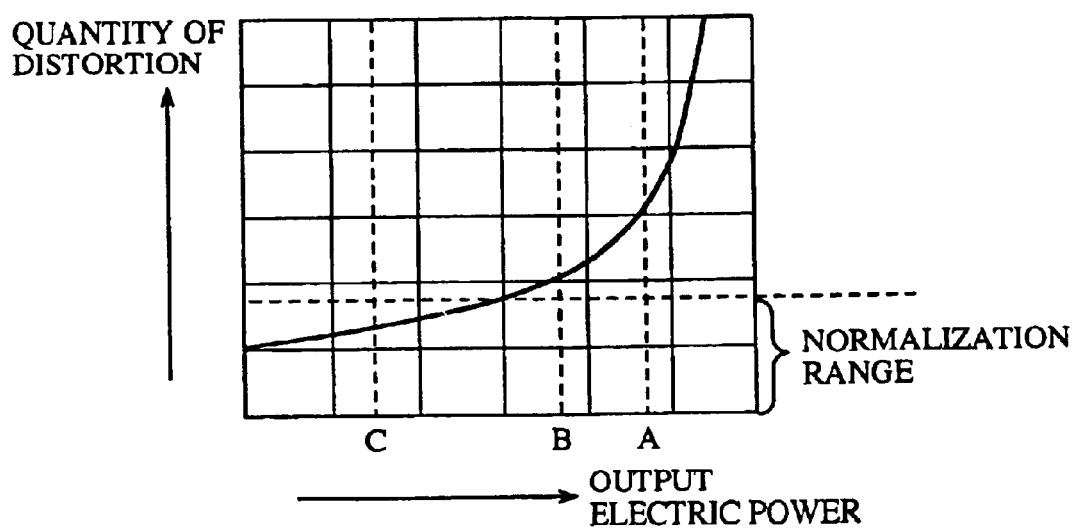
FIG. 2 is a view showing a quantity of distortion with respect to output electric power of an electric power amplifier.
Figure 3:
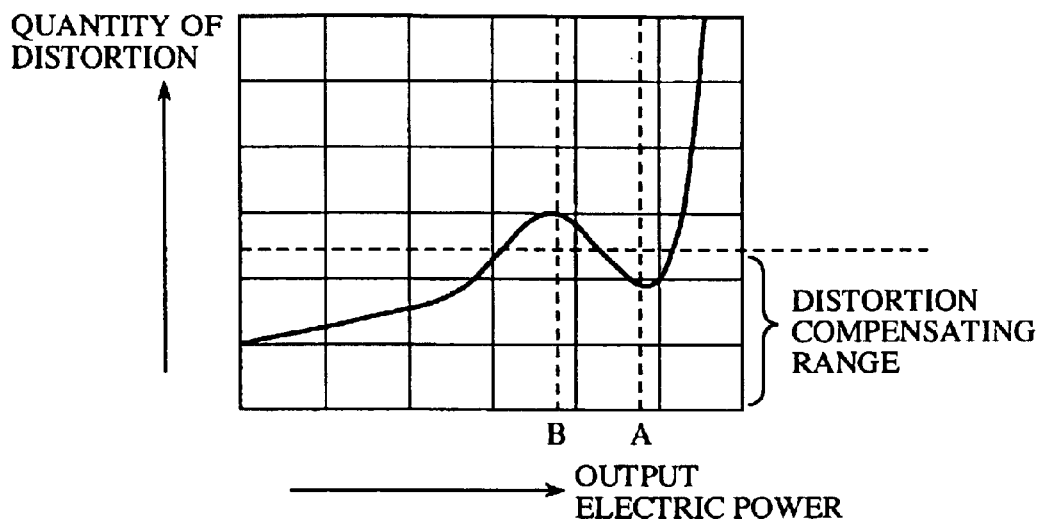
FIG. 3 is a view showing a quantity of distortion with respect to output electric power of an electric power amplifier which has characteristics of a higher order function.
Figure 8:
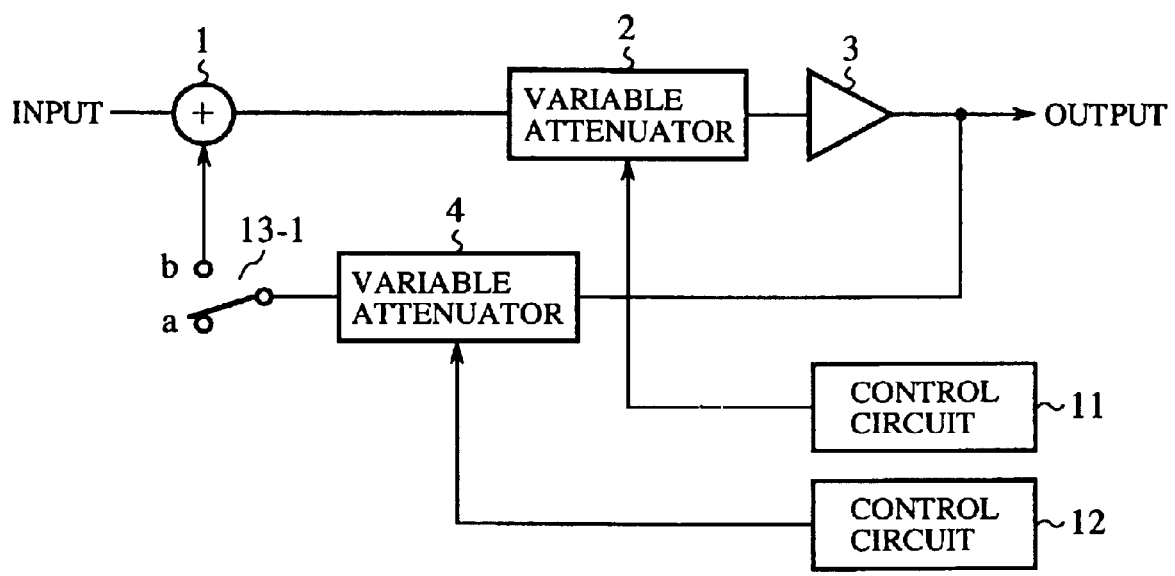
FIG. 8 is a block diagram showing the configuration of a distortion compensation output control circuit according to a second embodiment of the present invention.

FIG. 8 is a block diagram showing the configuration of a distortion compensation output control circuit according to a second embodiment of the present invention. In FIG. 8, 13-1 indicates a switching circuit for forming or cutting a feedback loop in the distortion compensation output control circuit. In cases where the value of the output electric power is low and the quantity of distortion is small, the switching circuit 13-1 is changed to an off condition by selecting a contact point "a" under the soft control.

The constituent elements, which are the same as those shown in FIG. 4, are indicated by the same reference numerals as those of the constituent elements shown in FIG. 4, and additional description of those constituent elements is omitted.

Next, an operation will be described below.

In cases where the switching circuit 13-1 is set in an on condition by selecting a contact point "b", the same operation as that in the first embodiment is performed. In the first embodiment, the loop gain αβ is controlled according to the value of the output electric power. In contrast, in the second embodiment, in cases where the value of the output electric power is low and the quantity of distortion is sufficiently small, the feedback loop in the distortion compensation output control circuit is set to the off condition by the switching circuit 13-1, and the control of the output electric power is performed in the variable attenuator 2.

In the equation (1), a ratio of the value of the output electric power in the distortion compensation output control circuit in case of the feedback loop set in the on condition to the value of the output electric power in case of the feedback loop set in the off condition is equal to almost 1/(1+αβ). However, in cases where the feedback loop is set in the off condition, the forward side gain α of the variable attenuator 2 is directly influenced on the output electric power. Therefore, in cases where the forward side gain α is multiplied by the same value 1(1+αβ) as the ratio while controlling the variable attenuator 2 by the control circuit 11 in cooperation with the switching circuit 13-1, a change of the value of the output electric power in the switching operation of the on/off setting of the feedback loop can be prevented, and the control of the output electric power in case of the feedback loop set in the off condition can be performed.

Figure 9:
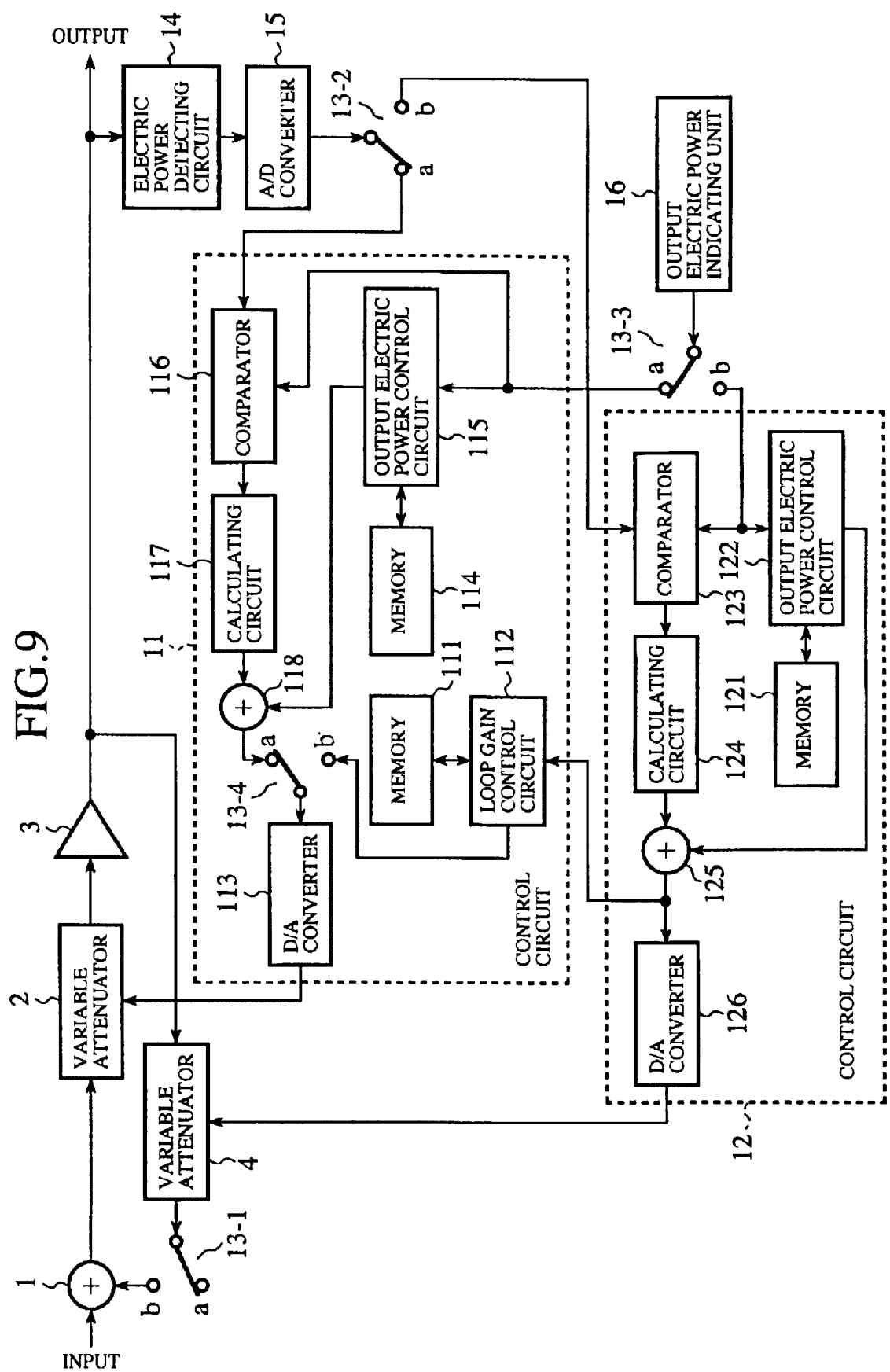
FIG. 9 is a block diagram showing an embodied configuration of the distortion compensation output control circuit shown in FIG. 8.

FIG. 9 is a block diagram showing an embodied configuration of the distortion compensation output control circuit shown in FIG. 8. In FIG. 9, the selection in each of a plurality of switching circuits 13-1 to 13-4 is changed to a contact point "a" when the value of the output electric power is low and the quantity of distortion is small, and the selection in each of the switching circuits 13-1 to 13-4 is changed to a contact point "b" when the value of the output electric power is high. In case of the change of the switching circuits 13-1 to 13-4 to the contact points "b", the distortion compensation output control circuit is the same as that of the first embodiment shown in FIG. 7 and is operated in the same manner as in the first embodiment. Therefore, additional description of the distortion compensation output control circuit is omitted.

A case where the selection in the switching circuits 13-1 to 13-4 is changed to the contact points "a" will be described below.

A phase of the output electric power output from the electric power amplifier 3 is detected in the electric power detecting circuit 14, the phase-detected output electric power is converted into a digital signal in the A/D converter 15, and the digital signal is input to a comparator 116 of the control circuit 11. An instruction indicating the output electric power of a prescribed value to be output from the electric power amplifier 3 is output from the output electric power indicating unit 16 to both an output electric power control circuit 115 and the comparator 116 of the control circuit 11 through the switching circuit 13-3.

In a memory 114 of the control circuit 11, a plurality of reference values, which are set in advance in correspondence to values of the output electric power for the purpose of controlling the variable attenuator 2, are stored in a form of a function or a table. In the output electric power control circuit 115, in response to the instruction indicating the output electric power of a prescribed value received from the output electric power indicating unit 16, a reference value corresponding to the prescribed value of the output electric power is read out from the merry 114 for the purpose of controlling the variable attenuator 2, and the reference value is output to the adder 118.

In the comparator 116, the phase-detected output electric power indicated by the A/D converter 15 is compared with the output electric power of the prescribed value indicated by the output electric power indicating unit 16, and a value of differential electric power denoting a difference between a value of the phase-detected output electric power and the prescribed value of the output electric power is output. In a calculating circuit 117, a correction value is calculated according to the value of the differential electric power output from the comparator 116 for the purpose of controlling the variable attenuator 2. In an adder 118, the reference value output from the output electric power control circuit 115 for the purpose of controlling the variable. attenuator 2 is added to the correction value output from the calculating circuit 117 for the purpose of controlling the variable attenuator 2, and a setting value is output through the switching circuit 13-4 for the purpose of controlling the variable attenuator 2. In a D/A converter 113, the setting value is converted into an analog signal and is input to the variable attenuator 2.

The variable attenuator 2 is controlled according to the input setting value, and the output electric power of the prescribed value is output from the electric power amplifier 3.

Here, the switching circuits 13-1 to 13-4 indicate a form of the control. Therefore, any means can be used as the switching circuits 13-1 to 13-4 on condition that the means sets the feedback loop to the on condition or the off condition.

In the second embodiment, in cases where the value of the output electric power is low and the quantity of distortion is sufficiently small, the feedback loop in the distortion compensation output control circuit is set to an off condition, and the control of the output electric power is performed in the variable attenuator 2 placed between the adder 1 and the electric power amplifier 3. However, it is applicable that gain changing means such as a changeable amplifier be used in place of the variable attenuator 2. Also, it is applicable that input side gain changing means be placed on the input side of the adder 1 to control the input electric power so as to perform the control of the output electric power in the input side gain changing means in place of the variable attenuator 2.

As is described above, in the second embodiment, in cases where a large quantity of output control is performed and the quantity of distortion is small due to a low value of the output electric power, the feedback loop is set to the off condition by the switching circuits 13-1 to 13-4, the variable attenuator 2 is controlled by the control. circuit 11, and the output electric power is controlled. Accordingly, probability of causing problems such as the increase of noise electric power and phase oscillation can be prevented.

Also, in the second embodiment, the feedback side elements can be perfectly cut off from the forward side elements by setting the feedback loop to the off condition, an electric source can be set to an off condition, and electric power consumed in the feedback side elements can be suppressed.

INDUSTRIAL APPLICABILITY

As is described above, the present invention is appropriate for the distortion compensation output control circuit in which output electric power and a quantity of distortion are controlled, a feedback loop is set to an off condition in case of a small quantity of distortion and the output electric power set to a low value, and the increase of noise electric power and phase oscillation are prevented.

What is claimed is:

1. A distortion compensation output control circuit, in which input electric power is amplified, output electric power of a prescribed value is output, a feedback loop is formed to perform negative feedback of a part of the output electric power and distortion occurring in the amplification of electric power is compensated, comprising:

an adder for adding a value of the input electric power and a value of the part of the output electric power negatively fed back together;

first gain changing means for increasing or decreasing a value of electric power output from the adder;

an electric power amplifier for amplifying electric power output from the first gain changing means and outputting the output electric power of the prescribed value;

second gain changing means for attenuating the output electric power output from the electric power amplifier and negatively feeding back the output electric power to the adder;

a second control circuit for controlling the second gain changing means to obtain the output electric power of the prescribed value; and a first control circuit for controlling the first gain changing means to obtain a loop gain of the feedback loop, the loop gain being variable, in correspondence to a quantity of distortion associated with the prescribed value of the output electric power.

2. A distortion compensation output control circuit according to claim 1, further comprising:

a switching circuit for setting the feedback loop to the adder to an on condition or an off condition, wherein the feedback loop is set to the off condition by the switching circuit in a case where the prescribed value of the output electric power is low and a quantity of the distortion in the output electric power is small, and the first gain changing means is controlled so as to obtain the output electric power of the prescribed value in the first control circuit.

3. A distortion compensation output control method, in which input electric power is amplified, output electric power of a prescribed value is output, a feedback loop is formed to perform negative feedback of a part of the output electric power and distortion occurring in the amplification of electric power according to both a forward side gain and a feedback side gain is compensated, comprising the steps of:

controlling the feedback side gain so as to obtain the output electric power of the prescribed value; and controlling the forward side gain so as to obtain a loop gain of the feedback loop, the loop gain being variable, in correspondence to a quantity of distortion associated with the prescribed value of the output electric power.

4. A distortion compensation output control method according to claim 3, further comprising the steps of:

setting the feedback loop to an off condition in a case where the prescribed value of the output electric power is low and a quantity of the distortion in the output electric power is small; and controlling the forward side gain so as to obtain the output electric power of the prescribed value.

* * * * *